US008575654B2

(12) United States Patent
Yin et al.

(10) Patent No.: US 8,575,654 B2
(45) Date of Patent: Nov. 5, 2013

(54) METHOD OF FORMING STRAINED SEMICONDUCTOR CHANNEL AND SEMICONDUCTOR DEVICE

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 161 days.

(21) Appl. No.: 13/059,285

(22) PCT Filed: Sep. 19, 2010

(86) PCT No.: PCT/CN2010/001436
§ 371 (c)(1),
(2), (4) Date: Feb. 16, 2011

(87) PCT Pub. No.: WO2012/016361
PCT Pub. Date: Feb. 9, 2012

(65) Prior Publication Data
US 2012/0032230 A1  Feb. 9, 2012

(30) Foreign Application Priority Data

Aug. 4, 2010  (CN) .......................... 2010 1 0244987

(51) Int. Cl.
*H01L 29/78*   (2006.01)
*H01L 21/20*   (2006.01)

(52) U.S. Cl.
USPC ........... 257/192; 257/288; 438/478; 977/890; 977/755

(58) Field of Classification Search
CPC ........ H01L 29/78; H01L 21/20; B82Y 40/00; B82Y 99/00
USPC .................... 438/478; 257/192, 288, E21.09, 257/E29.255; 977/890, 755
See application file for complete search history.

(56) References Cited

U.S. PATENT DOCUMENTS

| 6,310,367 | B1 | 10/2001 | Yagishita et al. | |
| 6,627,488 | B2 * | 9/2003 | Lee | 438/183 |
| 6,759,695 | B2 * | 7/2004 | Ma et al. | 257/192 |
| 2004/0000268 | A1 | 1/2004 | Wu et al. | 117/94 |
| 2005/0045972 | A1 | 3/2005 | Hanafi et al. | |
| 2005/0151163 | A1 * | 7/2005 | Hiyama et al. | 257/190 |
| 2006/0166417 | A1 | 7/2006 | Dokumaci et al. | 438/161 |
| 2007/0293009 | A1 * | 12/2007 | Currie et al. | 438/285 |

FOREIGN PATENT DOCUMENTS

| CN | 1525542 | 9/2004 |
| CN | 1612353 | 5/2005 |
| CN | 1790742 | 6/2006 |
| CN | 101101922 A | 1/2008 |
| CN | 101236968 | 8/2008 |

OTHER PUBLICATIONS

"Controlling threading dislocation densities in Ge on Si using graded SiGe layers and chemical-mechanical polishing", Currie et al., Applied Physics Letters, vol. 72, No. 14, Apr. 6, 1998; 3 pages.
International Search Report and Written Opinion of International Search Report in Chinese for PCT/CN2010/001436 filed Feb. 2011; 11 pages.
Second Chinese Office Action for Chinese Patent Application No. 201010244987.3, dated Jun. 7, 2013, 6 pages.
* cited by examiner

*Primary Examiner* — Walter H Swanson
(74) *Attorney, Agent, or Firm* — Westman, Champlin & Koehler, P.A.

(57) ABSTRACT

A method of forming a strained semiconductor channel, comprising: forming a relaxed SiGe layer on a semiconductor substrate; forming a dielectric layer on the relaxed SiGe layer and forming a sacrificial gate on the dielectric layer, wherein the dielectric layer and the sacrificial gate form a sacrificial gate structure; depositing an interlayer dielectric layer, which is planarized to expose the sacrificial gate; etching to remove the sacrificial gate and the dielectric layer to form an opening; forming a semiconductor epitaxial layer by selective semiconductor epitaxial growth in the opening; depositing a high-K dielectric layer and a metal layer; and removing the high-K dielectric layer and metal layer covering the interlayer dielectric layer by planarizing the deposited metal layer and high-K dielectric layer to form a metal gate. A semiconductor device manufactured by this process is also provided.

11 Claims, 11 Drawing Sheets

STRAINED Si

RELAXED SiGe

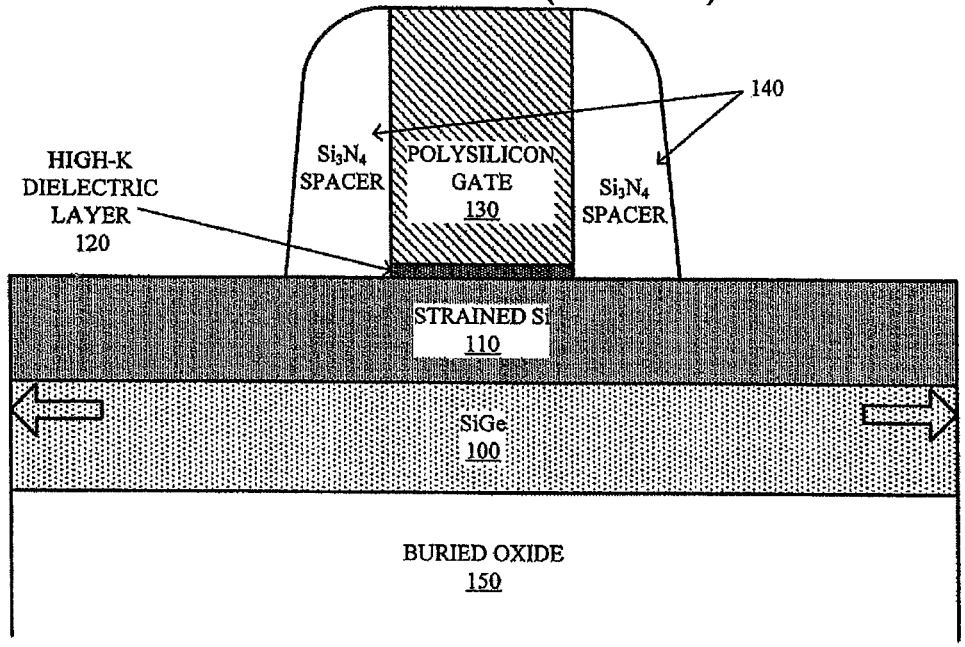
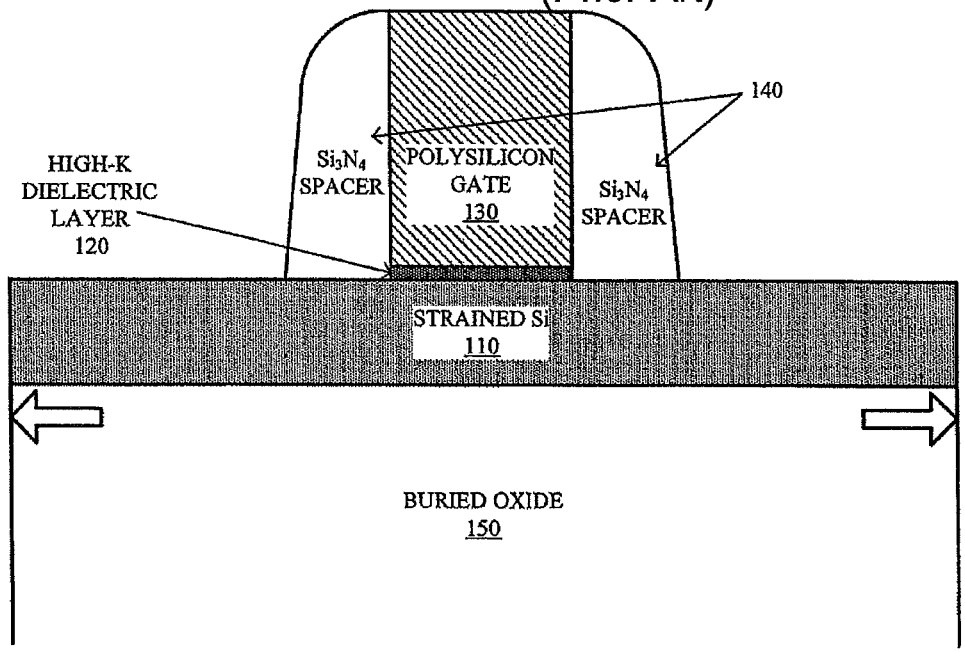

METHOD OF FORMING STRAINED SEMICONDUCTOR CHANNEL AND SEMICONDUCTOR DEVICE

CROSS-REFERENCE TO RELATED APPLICATION

This Application is a Section 371 National Stage Application of International Application No. PCT/CN2010/001436, filed Sep. 19, 2010, not yet published, the contents of which are hereby incorporated by reference in their entirety.

BACKGROUND OF THE INVENTION

1. Field of the Invention

The present invention relates to the field of semiconductor, and particularly to a semiconductor device and a manufacturing method thereof. More particularly, it relates to a method of forming a strained semiconductor channel and a semiconductor device manufactured by the method.

2. Description of the Prior Art

In SiGe semiconductor devices, tensile strained Si layer structure disposed on a relaxed SiGe layer is broadly used. Generally, the composition of the relaxed SiGe layer is represented by $Si_{1-x}Ge_x$, wherein $x \in [0,1]$.

FIG. 1A shows a schematic view of an atom crystal lattice of the tensile strained Si layer structure disposed on the relaxed SiGe layer. FIG. 1B shows an energy level structure of the tensile strained Si layer structure disposed on the relaxed SiGe layer. As shown in FIG. 1B, a conduction band in the tensile strained Si layer is lower than that in the relaxed SiGe layer, due to a large biaxial tension in the tensile strained Si layer. In such a structure, a very high in-plane mobility of electrons is obtained in the tensile strained Si layer.

Currie et al. described a manufacturing method of the relaxed layer and its performance in Applied Physics Letters (Vol. 72, No. 14, pp. 1718-20, 1998), as shown in FIGS. 2A-2D. FIG. 2A shows a longitudinal percentage distribution of Ge atoms of the relaxed SiGe layer. As shown in FIG. 2A, the percentage of the Ge atoms (Ge atom %) increases from 0% to 100% gradually from bottom to top. That is, the x in $Si_{1-x}Ge_x$ gradually varies from 0 to 1. The relaxed SiGe layer or Ge layer is obtained by growing a super thick (a few microns) SiGe layer on a Si substrate. Further, compressive strain in the relaxed SiGe layer is released by defect generation to obtain a relaxed SiGe layer or a Ge layer, as shown in FIG. 2B.

FIGS. 3A, 3B, and 3C respectively show three conventional method of forming the strained Si channel. FIG. 3A shows a structure of a strained Si/bulk SiGe MOSFET (Metal Oxide Semiconductor Field Effect Transistor). FIG. 3B shows a structure of an SGOI (SiGe-On-Insulator) MOSFET. FIG. 3C shows a structure of an SSDOI (Strained-SiGe-Directly-On-Insulator).

However, in the conventional method of forming the Si channel, it is necessary to form a strained Si blanket layer on the SiGe layer (or buried oxide) before device fabrication, such as shallow trench isolation (STI), gate formation, etc. This results in the following problems in the conventional method of forming the Si channel:

(1) The strained Si blanket layer can suffer loss during the device fabrication. For example, pad oxidation step in STI, sacrificial oxidation before gate formation, various wet chemical cleaning processes all can induce loss of the strained Si blanket layer.

(2) The strained Si blanket layer tends to relax in high-temperature step (i.e. the strain is released). For example, anneal for activating source/drain dopant may cause the strain in the strained Si blanket layer to be released.

SUMMARY OF THE INVENTION

In consideration of the above drawbacks of the conventional process, a method of forming a strained semiconductor channel, which forms the strained semiconductor channel of such as Si, Ge, or SiGe, after removing a sacrificial gate, so as to avoid the strained semiconductor channel being exposed to the high-temperature source/drain anneal. Further, the loss of the semiconductor layer is avoided since the strained semiconductor channel sees fewer process steps. A semiconductor device manufactured by the method is also provided.

A first solution including a method of forming a strained semiconductor channel, comprising: forming a relaxed SiGe layer on a semiconductor substrate; forming a dielectric layer on the relaxed SiGe layer and forming a sacrificial gate on the dielectric layer, wherein the dielectric layer and the sacrificial gate form a sacrificial gate stack structure; depositing an interlayer dielectric layer, which is planarized to expose the sacrificial gate; etching to remove the sacrificial gate and the dielectric layer to form an opening; forming a semiconductor epitaxial layer by selective semiconductor epitaxial growth in the opening; depositing a high-K dielectric layer and a metal layer; and removing the high-K dielectric layer and metal layer covering the interlayer dielectric layer by planarizing the deposited metal layer and high-K dielectric layer to form a metal gate.

Preferably, the semiconductor epitaxial layer is a Si epitaxial layer, a Ge epitaxial layer, or a SiGe epitaxial layer.

Preferably, the method of forming the strained semiconductor channel further comprises the following steps after removing the dielectric layer and before eptaxially growing the semiconductor epitaxial layer: etching the relaxed SiGe layer in the opening to obtain a space for the semiconductor epitaxial growth.

Preferably, the thickness of the semiconductor epitaxial layer is in a range of 5-10 nm.

Preferably, Ge atom % in the relaxed SiGe layer gradually varies from 20% near the semiconductor substrate to 100% far away from the semiconductor substrate.

Preferably, an etch stop layer is formed in the step for forming the relaxed SiGe layer. More preferably, Ge atom % of the etch stop layer is different from the relaxed SiGe layer.

A second solution provides a semiconductor device, comprising: a semiconductor substrate; a relaxed SiGe layer formed on the semiconductor substrate; a semiconductor epitaxial layer formed on the relaxed SiGe layer or embedded in the relaxed SiGe layer; a high-K dielectric layer located on a whole surface of the semiconductor epitaxial layer to form a hollow column with a bottom; and a metal gate filled in the hollow column formed by the high-K dielectric layer.

Preferably, the semiconductor epitaxial layer is a Si epitaxial layer, a Ge epitaxial layer, or a SiGe epitaxial layer.

Preferably, the thickness of the semiconductor epitaxial layer is in a range of 5-10 nm.

Preferably, the semiconductor device further comprises: a spacer located on the relaxed SiGe layer, and around an outer periphery of the semiconductor epitaxial layer and the high-K dielectric layer or around an outer periphery of the high-K dielectric layer; and an interlayer dielectric layer located on the relaxed SiGe layer and around an outer periphery of the spacer.

Preferably, Ge atom % in the relaxed SiGe layer gradually varies from 20% near the semiconductor substrate to 100% far away from the semiconductor substrate.

Preferably, an etch stop layer is included in the relaxed SiGe layer. More preferably, Ge atom % of the etch stop layer is different from the relaxed SiGe layer.

According to the present invention, it is unnecessary to form the strained Si blanket layer on the SiGe layer (or buried oxide) before device fabrication. By using the sacrificial gate, the strained semiconductor layer is formed after the sacrificial gate is removed, such that the strained semiconductor channel will not be exposed to the high-temperature source/drain anneal. Further, the strained semiconductor layer will suffer less loss by reducing the steps experienced by the strained semiconductor channel.

BRIEF DESCRIPTION OF THE DRAWINGS

The above and other objects, features and advantages of the present invention will become apparent from the following description about the exemplary embodiments of the present invention in connection with the drawings, wherein:

FIGS. 3A, 3B, and 3C respectively show three conventional method of forming a strained semiconductor channel;

FIGS. 4-14 show schematic views of each step of a manufacturing method of a semiconductor device according to a first embodiment of the present invention, wherein FIG. 14 shows a semiconductor device manufactured by the manufacturing method of the semiconductor device according to the first embodiment of the present invention;

FIGS. 4-9 and 15-18 show schematic views of each step of a manufacturing method of a semiconductor device according to a second embodiment of the present invention, wherein FIG. 18 shows a semiconductor device manufactured by the manufacturing method of the semiconductor device according to the second embodiment of the present invention.

It should be noted that the drawings are not drawn to scale but only exemplary. Therefore, they should not be construed as any limitation or constraint to the scope of the invention in the drawings, like reference signs indicate like elements.

DETAILED DESCRIPTION OF THE PREFERRED EMBODIMENTS

Next, preferred embodiments of the present invention will be explained in detail with reference to the drawings. The description omits details and functions that are not crucial to the present invention, in order not to obscure the concept of the present invention.

First Embodiment

Figure 14:
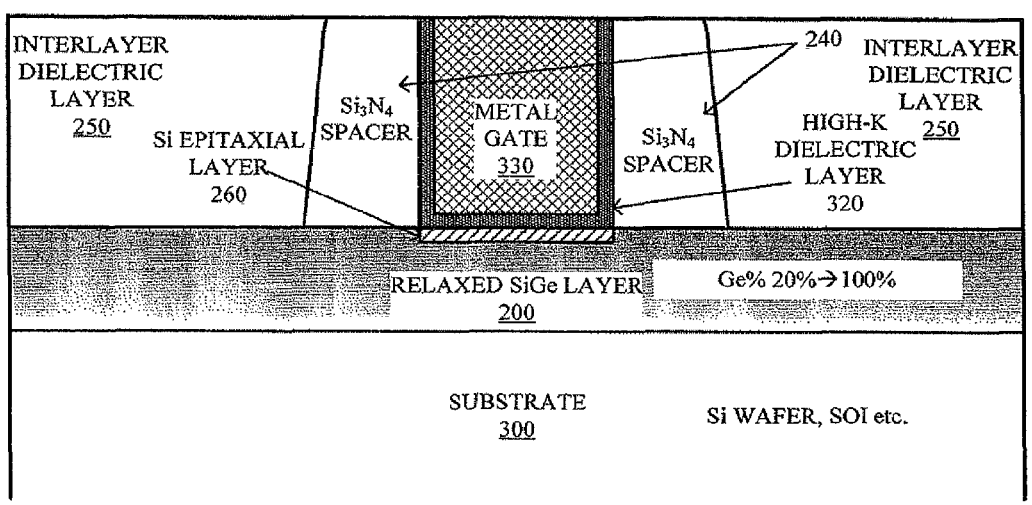

Firstly, a semiconductor device manufactured by a process of a first embodiment of the present invention is explained in detail with reference to FIG. 14. FIG. 14 shows a schematic view of the semiconductor device manufactured by the manufacturing method of the semiconductor device according to the first embodiment of the present invention.

As shown in FIG. 14, the semiconductor device manufactured by the process of the first embodiment of the present invention mainly comprises: a substrate 300 (Si wafer, SOI, etc.); a relaxed SiGe layer 200 (Ge atom % varies from 20% to 100% in a bottom-to-top direction as shown in FIG. 14); a semiconductor epitaxial layer 260 (a Si epitaxial layer as shown in the figure, but a Ge epitaxial layer or a SiGe epitaxial layer is also possible) with a thickness of 5-10 nm; a high-K dielectric layer 320 with a thickness of 1-3 nm; a metal gate 330; a $Si_3N_4$ spacer 240 with a thickness of 10-40 nm; and an interlayer dielectric layer 250 with a thickness of 15-50 nm, wherein: the relaxed SiGe layer 200 is formed on the substrate 300; a gate structure formed by the $Si_3N_4$ spacer 240, the Si epitaxial layer 260, the high-K dielectric layer 320, and the metal gate 330 is formed on the relaxed SiGe layer 200; the interlayer dielectric layer 250 is deposited on the relaxed SiGe layer 200 and around an outer periphery of the $Si_3N_4$ spacer 240 of the gate structure; the Si epitaxial layer 260 is formed on the relaxed SiGe layer 200 and embedded in the relaxed SiGe layer 200; the high-K dielectric layer 320 is deposited on a whole surface of the Si epitaxial layer 260 and is formed as a hollow column with a bottom; a metal gate 330 is filled in the hollow column formed by the high-K dielectric layer 320; and the $Si_3N_4$ spacer 240 is formed on the relaxed SiGe layer 200 and around an outer periphery of the high-K dielectric layer 320.

According to the first embodiment of the present invention, it is unnecessary to form the strained Si blanket layer on the SiGe layer 200 before device fabrication, particularly before forming the source/drain regions. By using the sacrificial gate process, the Si epitaxial layer 260 is formed after the sacrificial gate is removed and the source/drain regions are formed, such that the strained Si channel will not be exposed to the high-temperature source/drain anneal process. Further, the Si epitaxial layer 260 will suffer less loss by reducing the steps experienced by the strained Si channel.

Next, each step of a manufacturing method of the semiconductor device according to the first embodiment of the present invention is explained in detail with reference to FIGS. 4-14.

Figure 1A:
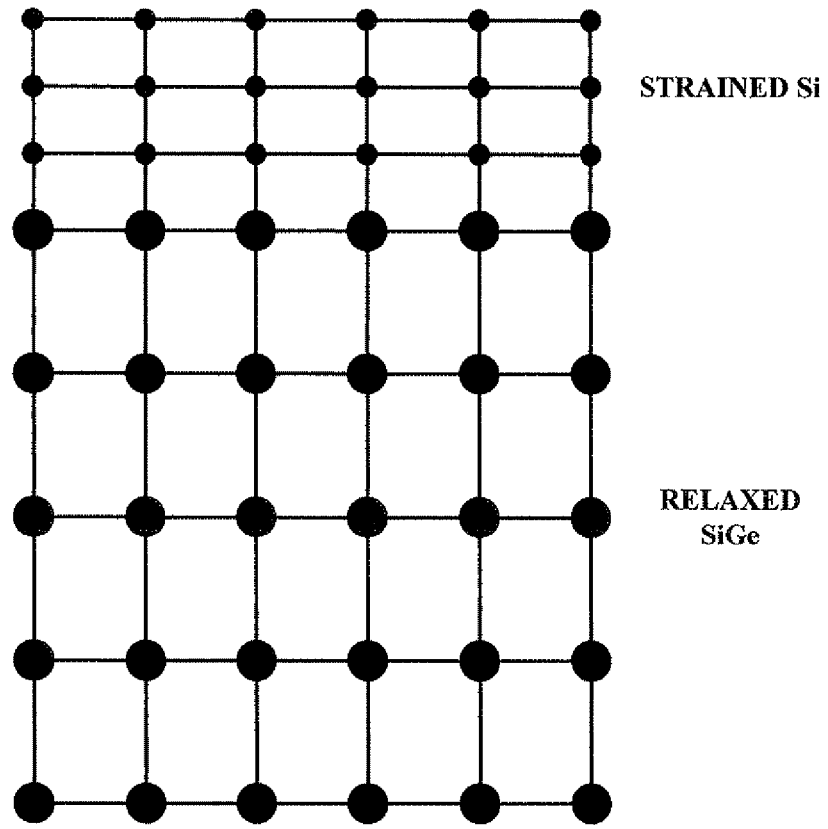
FIG. 1A shows a schematic view of atom lattice of a tensile strained Si layer structure disposed on a relaxed SiGe layer.
Figure 1B:
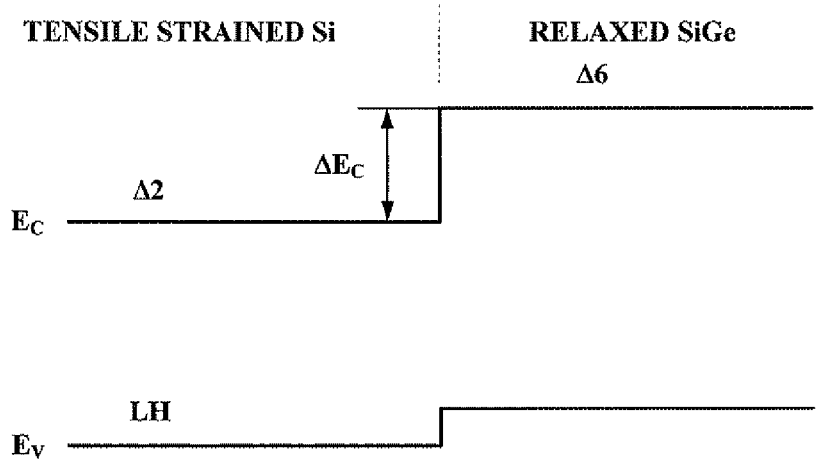
FIG. 1B shows energy level structure of a tensile strained Si layer structure disposed on a relaxed SiGe layer.
Figure 2A:
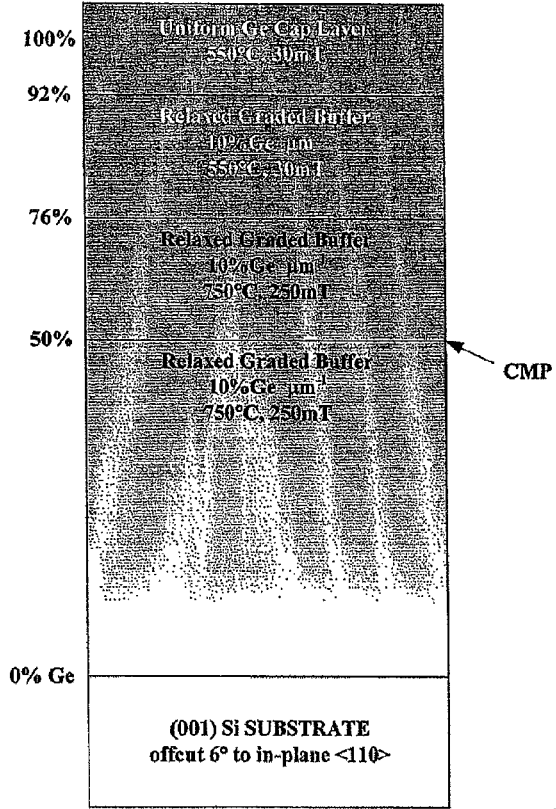
FIGS. 2A and 2B show schematic views of a manufacturing method of a relaxed layer and its performance.
Figure 2B:
Figure 3A:
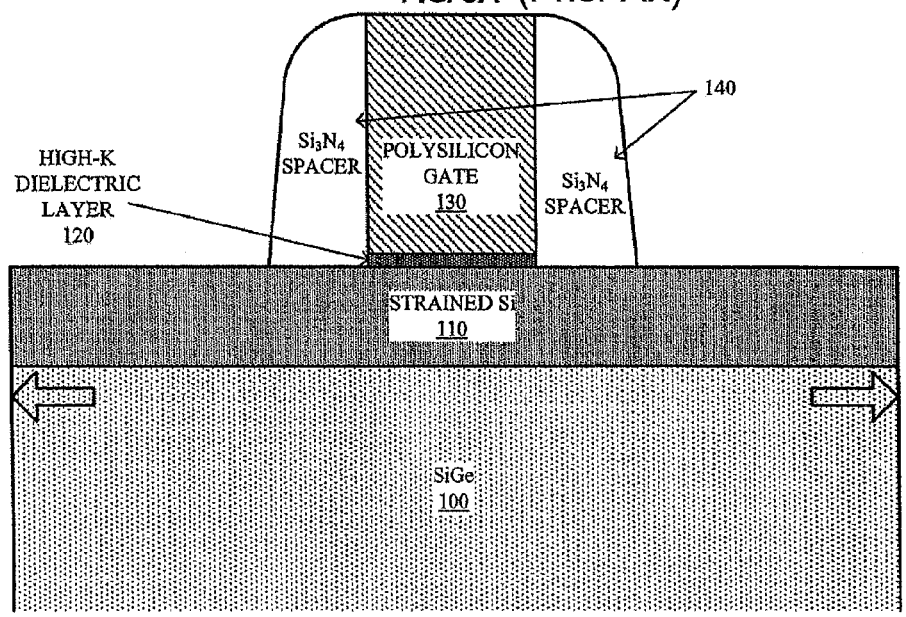
Figure 4:
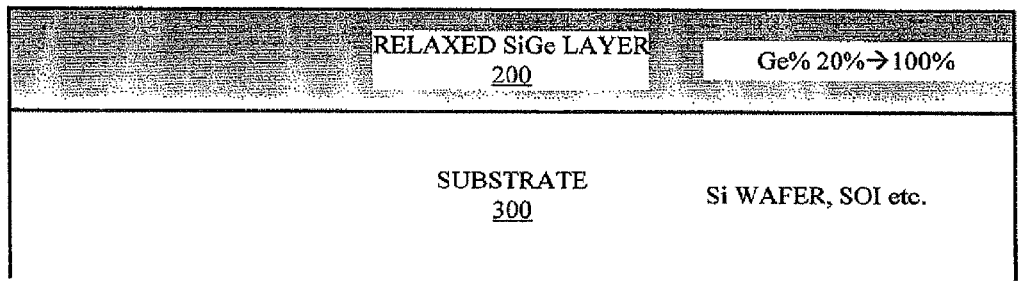
Figure 10:
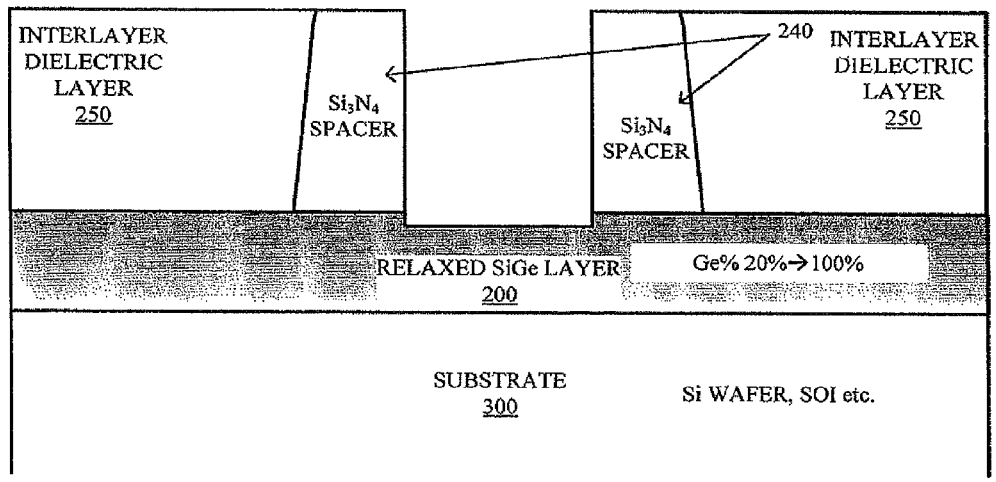

First, as shown in FIG. 4, a relaxed SiGe layer 200 is formed on a substrate 300 (Si wafer, SOI, etc.). In the relaxed SiGe layer 200, Ge atom %, i.e., the percentage of the number of the Ge atoms versus the total number of atoms, varies from e.g. 20% to 100% in a bottom-to-top direction as shown in FIG. 4 (i.e. in a direction from near the substrate 300 to far away from the substrate 300). In other words, the x in $Si_{1-x}Ge_x$ gradually varies from 0.2 to 1. A specific composition of the relaxed SiGe layer 200 described herein is only exemplary. Those skilled in the art can choose other proper composition with a reselected varying range of x according to actual requirements. The gradual variation of x can be linear, hyperbolic, exponential, and alike. Optionally, as shown in FIG. 10, an etch stop layer can be formed in the relaxed SiGe layer 200, e.g. by changing the percentage of the Ge atoms, to control the etching depth to be performed in the step shown in FIG. 10. Specifically, the etching depth can be controlled by forming a stack structure of relaxed layer/etch stop layer/relaxed layer in the relaxed SiGe layer 200 as required.

Figure 5:
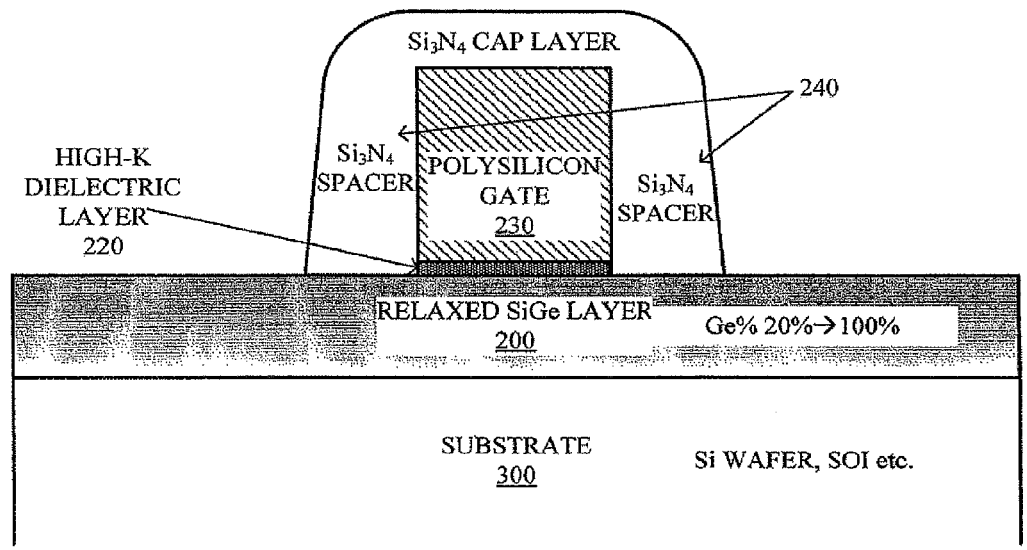

Then, as shown in FIG. 5, a sacrificial gate structure comprising a dielectric layer 220, a sacrificial gate 230 (a polysilicon gate 230 as shown in the figure, or other materials known in the art), a $Si_3N_4$ spacer 240 and a $Si_3N_4$ cap layer surrounding and covering the dielectric layer 220 and the polysilicon gate 230 is formed on the relaxed SiGe layer 200. As an example of the present invention, the thickness of the dielectric layer 220 is 1-3 nm, the thickness of the polysilicon gate 230 is 20-70 nm, the horizontal thickness as shown in the figure of the $Si_3N_4$ spacer 240 is 10-40 nm, the thickness of the $Si_3N_4$ cap layer is 15-40 nm. This step is also a part of a conventional process, wherein the polysilicon gate 230 is formed as the sacrificial gate to be replaced by a metal gate.

Optionally, source/drain regions (not shown) are formed by a regular method such as ion implantation and high-temperature anneal in the semiconductor intermediate structure having the sacrificial gate structure.

Figure 6:
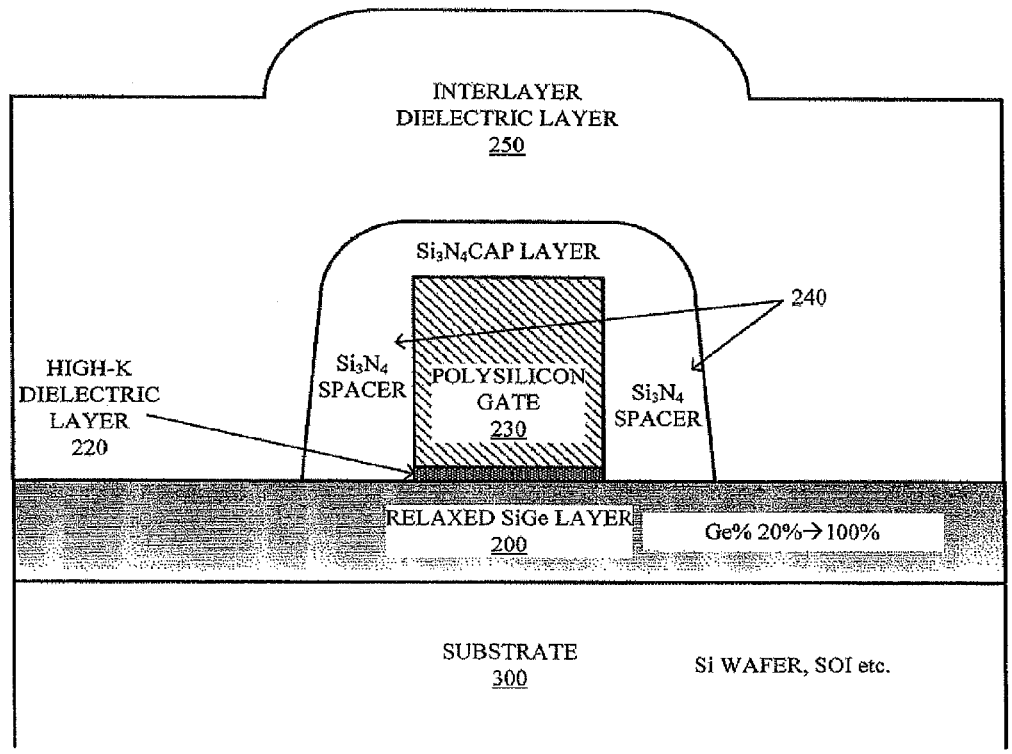

Then, as shown in FIG. 6, an interlayer dielectric layer 250 is deposited on the relaxed SiGe layer 200 having the sacrificial gate structure formed thereon. For example, the interlayer dielectric layer 250 can be formed of undoped $SiO_2$, various doped $SiO_2$ (e.g. borosilicate glass or boron-phosphorosilicate glass, etc.), and $Si_3N_4$.

Figure 7:
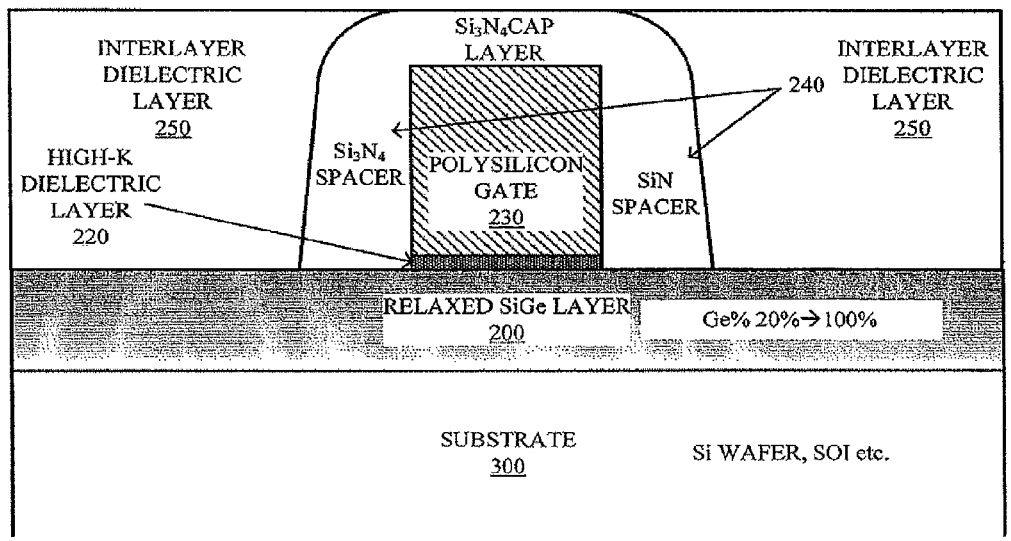

Next, as shown in FIG. 7, the interlayer dielectric layer 250 is polished by chemical mechanical polish (CMP) to expose the $Si_3N_4$ cap layer of the sacrificial gate structure.

Figure 8:
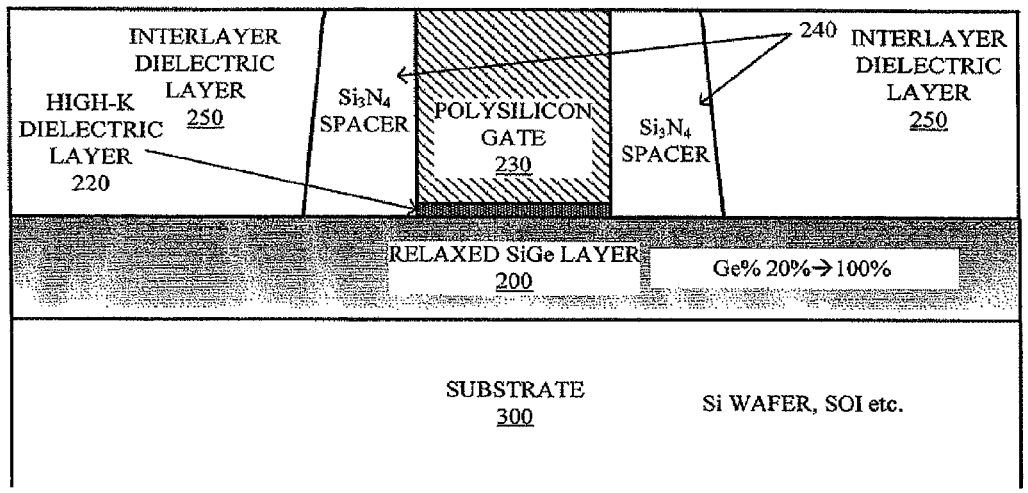

Then, as shown in FIG. 8, the $Si_3N_4$ cap layer is removed by a further CMP or reactive ion etching (RIE) of $Si_3N_4$, to expose the polysilicon gate 230 of the sacrificial gate structure.

Figure 9:
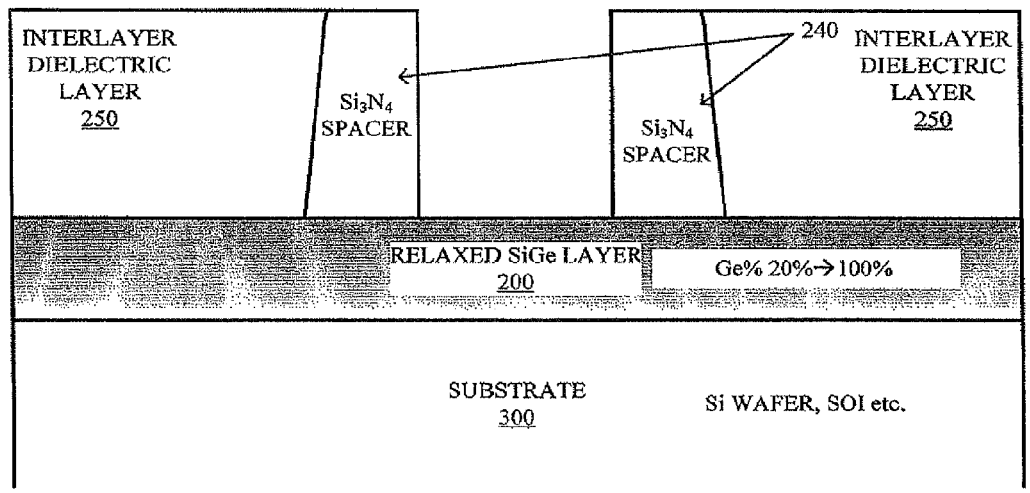

Then, as shown in FIG. 9, the polysilicon gate 230 is removed by wet or dry etching.

Next, as shown in FIG. 10 the relaxed SiGe layer 200 is etched by wet or dry etching to produce a space for Si epitaxial growth. The etching depth is 5-10 nm. Optionally, as previously described with reference to FIG. 4, the etching depth can be controlled by means of forming an etch stop layer in the relaxed SiGe layer 200 by e.g. changing the percentage of the Ge atoms.

Figure 11:
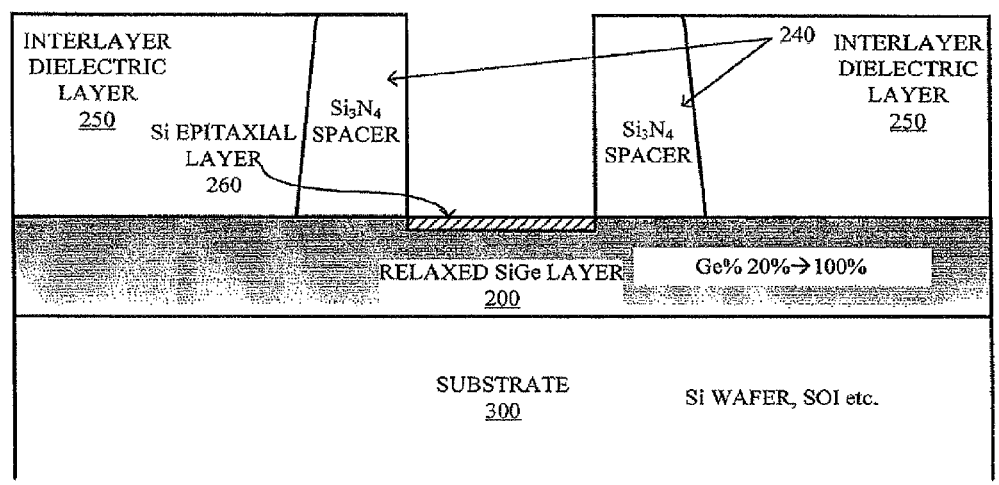

Then, as shown in FIG. 11, selective Si epitaxial growth is performed in an opening formed by etching, to form a Si epitaxial layer 260 embedded in the relaxed SiGe layer 200. A top surface of the Si epitaxial layer 260 and a top surface of the relaxed SiGe layer 200 can be in a same plane (as shown in FIG. 11) or otherwise (not shown).

Figure 12:
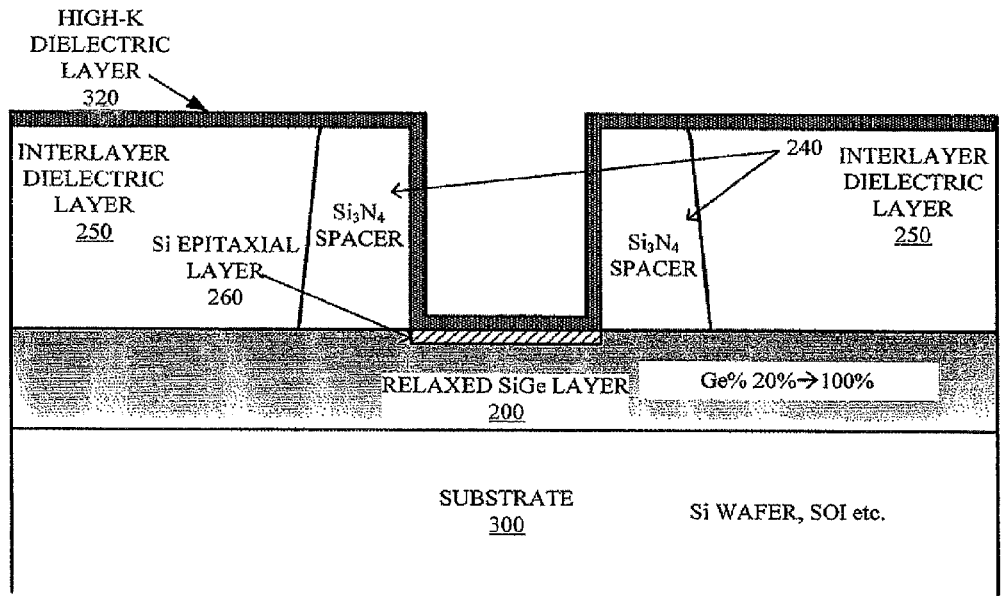

Then, as shown in FIG. 12, a high-K dielectric layer 320 is deposited on a surface of the structure shown in FIG. 11. The deposition thickness is in a range of 1-3 nm.

Figure 13:
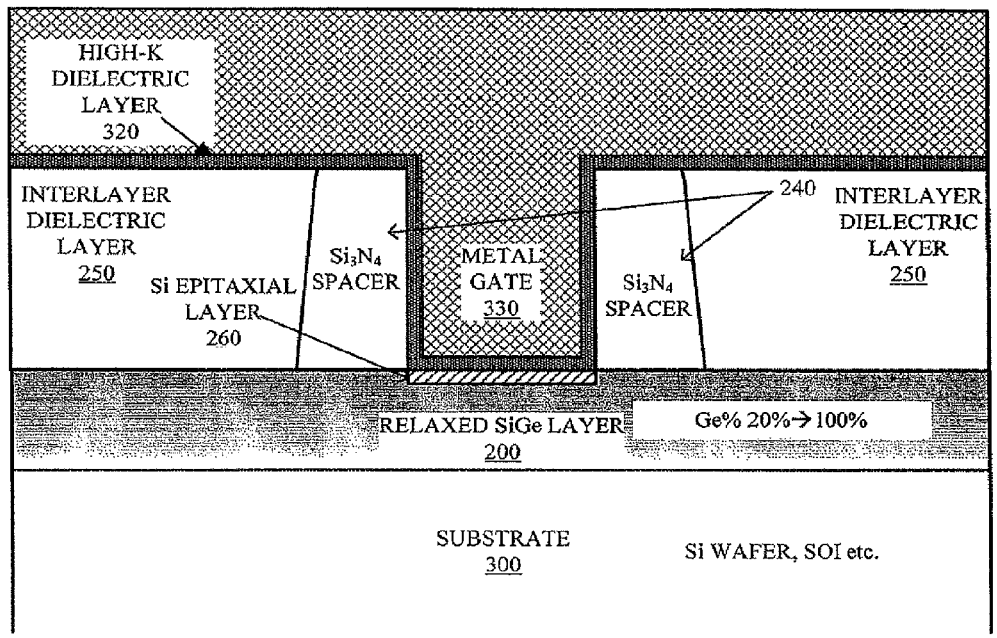

Next, as shown in FIG. 13, a metal layer for forming a metal gate 330 is deposited on a surface of the high-K dielectric layer 320. According to the present invention, the metal layer can comprise multiple conductive layers. For example, a TiN layer is deposited first and then a TiAl layer is deposited.

Finally, as shown in FIG. 14, the formed metal layer and high-K dielectric layer 320 are planarized by e.g. CMP process to remove the high-K dielectric layer 320 and the metal layer covering a top of the interlayer dielectric layer 250 and the $Si_3N_4$ spacer 240 to form the metal gate 330. After this step, the polysilicon gate 230 as the sacrificial gate is completely replaced by the metal gate 330.

Then, semiconductor manufacturing process can be performed as conventional to e.g. form source silicide/drain silicide, and/or form CMOS devices, etc.

According to the first embodiment of the present invention, it is unnecessary to form the strained Si blanket layer on the SiGe layer 200 before device fabrication, particularly before forming the source/drain regions. By using the sacrificial gate process, the Si epitaxial layer 260 is formed after the sacrificial gate is removed and the source/drain regions are formed, such that the strained Si channel will not be exposed to the high-temperature source/drain anneal process. Further, the Si epitaxial layer 260 will suffer less loss by reducing the steps experienced by the strained Si channel.

Second Embodiment

Figure 18:
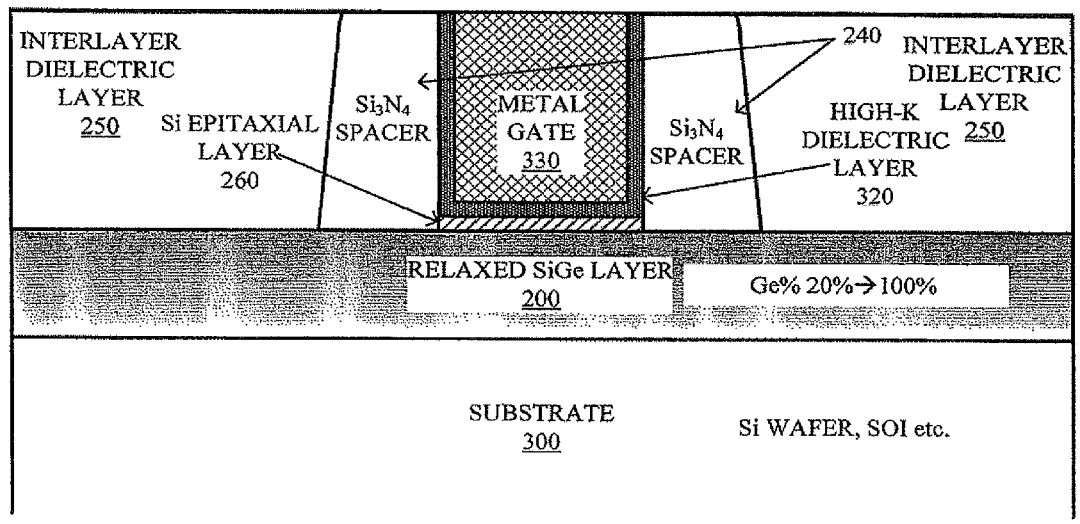

Firstly, a semiconductor device manufactured by a process of a second embodiment of the present invention is explained in detail with reference to FIG. 18. FIG. 18 shows a schematic view of the semiconductor device manufactured by the manufacturing method of the semiconductor device according to the second embodiment of the present invention.

As shown in FIG. 18, the semiconductor device manufactured by the process of the second embodiment of the present invention mainly comprises: a substrate 300 (Si wafer, SOI, etc.); a relaxed SiGe layer 200 (Ge atom % varies from 20% to 100% in a bottom-to-top direction as shown in FIG. 18); a semiconductor epitaxial layer 260 (a Si epitaxial layer as shown in the figure, but a Ge epitaxial layer or a SiGe epitaxial layer is also possible) with a thickness of 5-10 nm; a high-K dielectric layer 320 with a thickness of 1-3 nm; a metal gate 330; a $Si_3N_4$ spacer 240 with a thickness of 10-40 nm; and an interlayer dielectric layer 250 with a thickness of 15-50 nm, wherein: the relaxed SiGe layer 200 is formed on the substrate 300; a gate structure formed by the $Si_3N_4$ spacer 240, the Si epitaxial layer 260, the high-K dielectric layer 320, and the metal gate 330 is formed on the relaxed SiGe layer 200; the interlayer dielectric layer 250 is deposited on the relaxed SiGe layer 200 and around an outer periphery of the $Si_3N_4$ spacer 240 of the gate structure; the Si epitaxial layer 260 is formed on the relaxed SiGe layer 200; the high-K dielectric layer 320 is deposited on a whole surface of the Si epitaxial layer 260 and is formed as a hollow column with a bottom; a metal gate 330 is filled in the hollow column formed by the high-K dielectric layer 320; and the $Si_3N_4$ spacer 240 is formed on the relaxed SiGe layer 200 and around an outer periphery of the Si epitaxial layer 260 and the high-K dielectric layer 320.

According to the second embodiment of the present invention, it is unnecessary to form the strained Si blanket layer on the SiGe layer 200 before device fabrication, particularly before forming the source/drain regions. By using the sacrificial gate process, the Si epitaxial layer 260 is formed after the sacrificial gate is removed and the source/drain regions are formed, such that the strained Si channel will not be exposed to the high-temperature source/drain anneal process. Further, the Si epitaxial layer 260 will suffer less loss by reducing the steps experienced by the strained Si channel.

Next, each step of a manufacturing method of the semiconductor device according to the second embodiment of the present invention is explained in detail with reference to FIGS. 4-9 and 15-18.

Steps of FIGS. 4-9 are the same as the first embodiment, and a detailed description thereof is omitted for concision. Specific content of these steps can be known by referring to the detailed description in the first embodiment.

As shown in FIG. 9, the polysilicon gate 230 has been removed by wet or dry etching.

Figure 15:
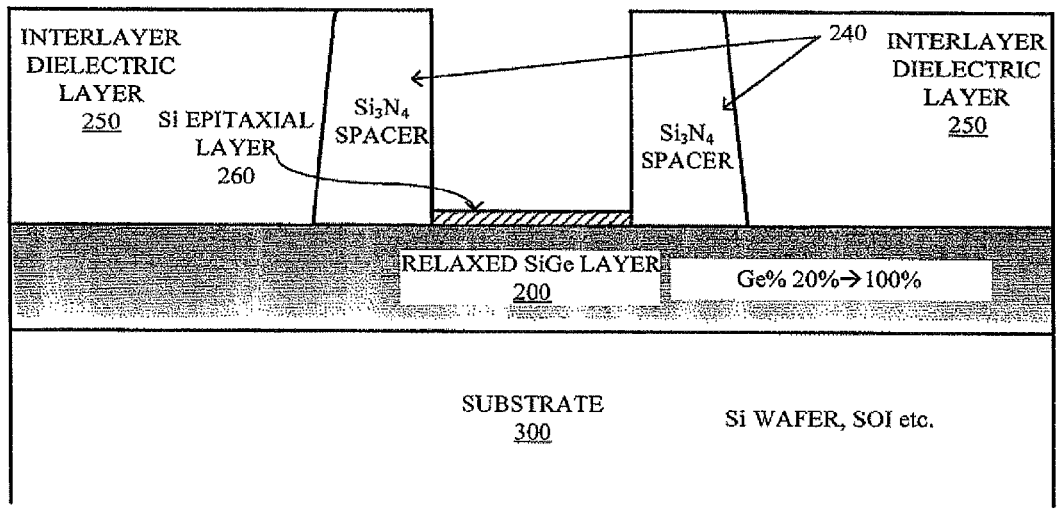

Next, as shown in FIG. 15, selective Si epitaxial growth is performed directly on the relaxed SiGe layer 200 and in the opening formed by the $Si_3N_4$ spacer 240, to form a Si epitaxial layer 260 on a top surface of the relaxed SiGe layer 200. The thickness of Si epitaxial layer 260 is 5-10 nm.

Figure 16:
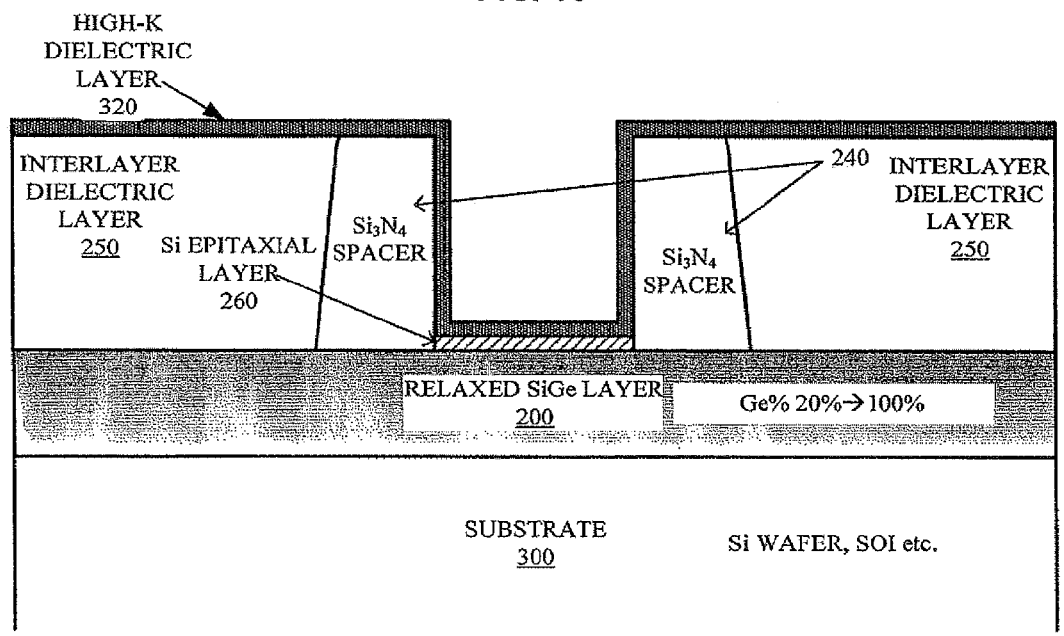

Then, as shown in FIG. 16, a high-K dielectric layer 320 is deposited on a surface of a structure shown in FIG. 15. The deposition thickness is in a range of 1-3 nm.

Figure 17:
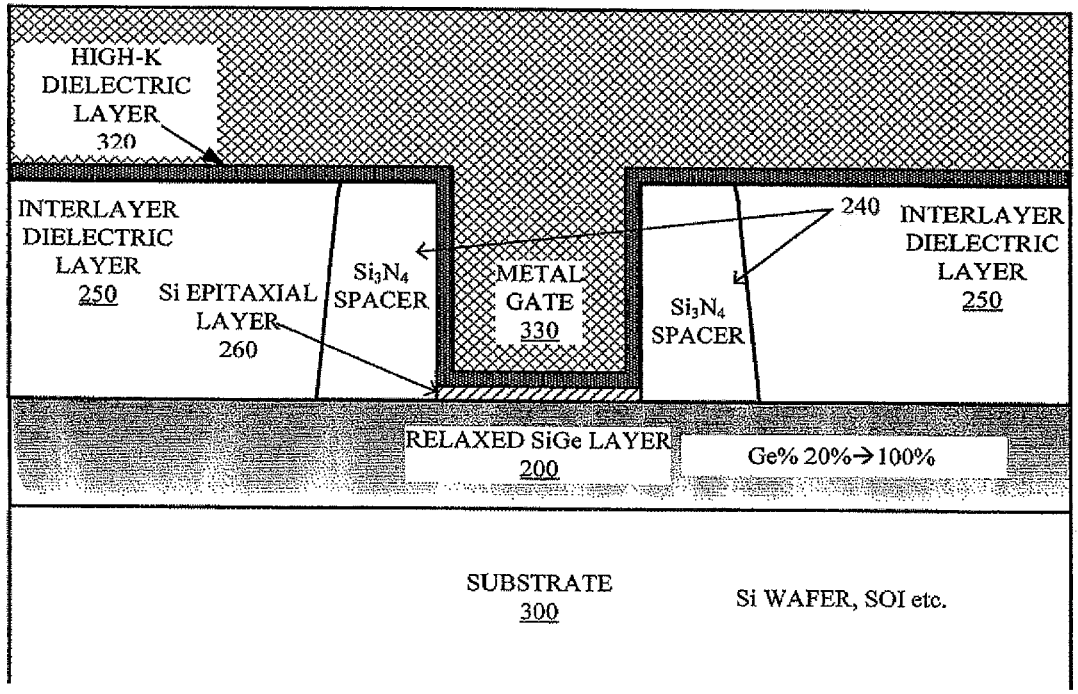

Next, as shown in FIG. 17, a metal layer for forming a metal gate 330 is deposited on a surface of the high-K dielectric layer 320. According to the present invention, the metal layer can comprise multiple conductive layers. For example, a TIN layer is deposited first and then a TiAl layer is deposited.

Finally, as shown in FIG. 18, the formed metal layer and high-K dielectric layer 320 are planarized by e.g. CMP process to remove the high-K dielectric layer 320 and the metal layer covering a top of the interlayer dielectric layer 250 and the $Si_3N_4$ spacer 240 to form the metal gate 330. After this step, the polysilicon gate 230 as the sacrificial gate is completely replaced by the metal gate 330.

Then, semiconductor manufacturing process can be performed as conventional to e.g. form source silicide/drain silicide, and/or form COMS devices, etc.

According to the second embodiment of the present invention, it is unnecessary to form the strained Si blanket layer on the SiGe layer 200 before device fabrication, particularly before forming the source/drain regions. By using the sacrificial gate process, the Si epitaxial layer 260 is formed after the sacrificial gate is removed and the source/drain regions are formed, such that the strained Si channel will not be exposed to the high-temperature source/drain anneal process. Further, the Si epitaxial layer 260 will suffer less loss by reducing the steps experienced by the strained Si channel.

The present invention has been described in connection with preferred embodiments. It should be understood that those skilled in the art can make various changes, substitutions, and additions without departing from the spirit and scope of the present invention. Therefore, the scope of the present invention is not limited to the above specific embodiments, but is defined by the appended claims.

What is claimed is:

1. A method of forming a strained semiconductor channel, comprising steps of:
    forming a relaxed SiGe layer on a semiconductor substrate, wherein an etch stop layer is formed in the forming the relaxed SiGe layer;
    forming a dielectric layer on the relaxed SiGe layer and forming a sacrificial gate on the dielectric layer, wherein the dielectric layer and the sacrificial gate form a sacrificial gate stack structure;
    depositing an interlayer dielectric layer, which is planarized to expose the sacrificial gate;
    etching to remove the sacrificial gate and the dielectric layer to form an opening;
    etching the relaxed SiGe layer through the opening and stopping on the etch stop layer;
    forming a semiconductor epitaxial layer by selective semiconductor epitaxial growth in the opening, wherein the semiconductor epitaxial layer is flush with the relaxed SiGe layer;
    depositing a high-K dielectric layer and a metal layer; and
    removing the high-K dielectric layer and metal layer covering the interlayer dielectric layer by planarizing the deposited metal layer and high-K dielectric layer to form a metal gate.

2. The method of forming the strained semiconductor channel according to claim 1, wherein the semiconductor epitaxial layer is a Si epitaxial layer, a Ge epitaxial layer, or a SiGe epitaxial layer.

3. The method of forming the strained semiconductor channel according to claim 1, wherein a thickness of the semiconductor epitaxial layer is in a range of 5-10 nm.

4. The method of forming the strained semiconductor channel according to claim 1, wherein Ge atom % in the relaxed SiGe layer gradually varies from 20% near the semiconductor substrate to 100% far away from the semiconductor substrate.

5. The method of forming the strained semiconductor channel according to claim 1, wherein Ge atom % of the etch stop layer is different from the relaxed SiGe layer.

6. A semiconductor device, comprising:
    a semiconductor substrate;
    a relaxed SiGe layer formed on the semiconductor substrate, wherein an etch stop layer is included in the relaxed SiGe layer;
    a semiconductor epitaxial layer formed on the etch stop layer and embedded in the relaxed SiGe layer with its top surface flush with a top surface of the relaxed SiGe layer;
    a high-K dielectric layer located on a whole surface of the semiconductor epitaxial layer to form a hollow column with a bottom; and
    a metal gate filled in the hollow column formed by the high-K dielectric layer.

7. The semiconductor device according to claim 6, wherein the semiconductor epitaxial layer is a Si epitaxial layer, a Ge epitaxial layer, or a SiGe epitaxial layer.

8. The semiconductor device according to claim 6, wherein a thickness of the semiconductor epitaxial layer is in a range of 5-10 nm.

9. The semiconductor device according to claim 6, further comprising:
    a spacer located on the relaxed SiGe layer, and around an outer periphery of the high-K dielectric layer; and
    an interlayer dielectric layer located on the relaxed SiGe layer and around an outer periphery of the spacer.

10. The semiconductor device according to claim 6, wherein Ge atom % in the relaxed SiGe layer gradually varies from 20% near the semiconductor substrate to 100% far away from the semiconductor substrate.

11. The semiconductor device according to claim 6, wherein Ge atom % of the etch stop layer is different from the relaxed SiGe layer.

* * * * *